United States Patent [19]

Loucks

[11] 4,150,307
[45] Apr. 17, 1979

[54] LINE MODULATOR NONDISSIPATIVE SERIES REGULATOR

[75] Inventor: Richard S. Loucks, Northridge, Calif.

[73] Assignee: International Telephone and Telegraph Corporation, New York, N.Y.

[21] Appl. No.: 836,092

[22] Filed: Sep. 23, 1977

[51] Int. Cl.² ............................ H03K 3/30; H03K 3/86
[52] U.S. Cl. .................................... 307/284; 307/282; 328/65; 328/67
[58] Field of Search ................. 328/65, 67; 307/282, 307/284

[56] References Cited

U.S. PATENT DOCUMENTS

| | | | |
|---|---|---|---|
| 3,139,585 | 6/1964 | Ross et al. | 328/65 |
| 3,328,703 | 6/1967 | Lee | 328/65 |
| 3,333,120 | 7/1967 | Tomlin | 307/284 |
| 3,363,184 | 1/1968 | Smith | 328/65 |
| 3,374,443 | 3/1968 | Braum et al. | 307/284 |

Primary Examiner—John S. Heyman
Attorney, Agent, or Firm—William T. O'Neil

[57] ABSTRACT

A regulating charging circuit for the pulse-forming network in a line-type pulse modulator, such as commonly found in pulsed radar systems. A charging inductor is the primary of a transformer, the secondary of which is open-circuited until the resonant charge of the pulsed-forming network reaches a predetermined voltage. At that time, a sensor generates a trigger enabling a solid state device, of the thyristor genera, to connect the secondary of the charging inductor/transformer to a step-up network, including a second transformer. The output of the step-up network is fed through a diode into the filter/storage capacitor of the high voltage power supply from which the charging inductor draws current. The unused charging conductor energy is thereby recovered and used to help recharge the filter/storage capacitor. The combination including the step-up network relieves the thyristor and control circuits from the requirement of controlling high voltages.

6 Claims, 1 Drawing Figure

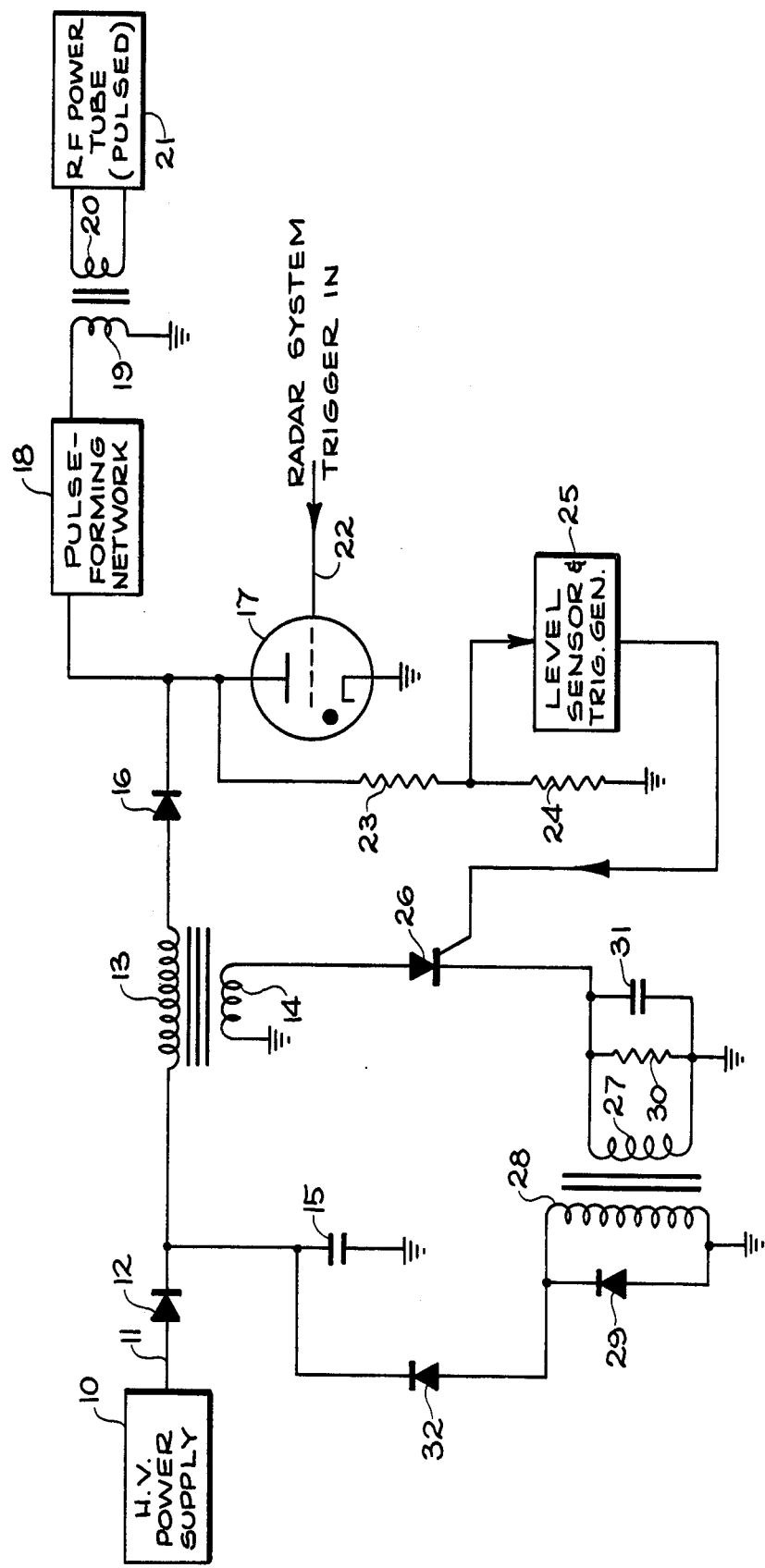

LINE MODULATOR NONDISSIPATIVE SERIES REGULATOR

BACKGROUND OF THE INVENTION

1. Field of the Invention

The invention relates to regulated power supply circuitry for low duty cycle, high voltage load pulsing and, more particularly, to such devices of the energy conservative type which also incorporate a regulating function.

2. Description of the Prior Art

As is well known in the prior art, the typical microwave thermionic power device, such as the magnetron, amplitron, etc., requires high voltage pulsing. The so-called line-type modulator is a well known device used in connection with a high voltage switch (such as the hydrogen thyratron, for example) to couple a high voltage pulse, usually through a suitable pulse transformer to the microwave power tube which is operative as a microwave oscillator or amplifier. Such devices are desicrbed in the text, *Radar Handbook*, by Merill I. Skolnik (McGraw-Hill Book Company, 1970), particularly in Chapter 7 thereof.

The process of disposing of excess charging choke (inductor) energy is sometimes referred to as de-Q-ing. The aforementioned *Radar Handbook* describes this process in its Chapter 7 and illustrates two forms of dissipative-type regulators in FIG. 49. Those devices are based on the dissipation of excess charging choke (inductor) energy in a high-current-rated vacuum tube shunted across the charging choke and controlled to conduct at the appropriate time corresponding to charging of the pulse-forming network to the desired point. The prime disadvantage of such systems is that, at high line voltages, up to 30% of the input power is wasted ultimately as heat.

The same chapter of the *Radar Handbook* text also shows, in FIG. 50, two forms of resonant-charging regulators which are of the energy-conservative type. In these, the secondary of the charging inductor is enabled (i.e., connected directly or through a diode) to feed back to the power supply filter/storage capacitor. In one form of FIG. 50 of the Handbook reference, a series triode at high voltage interrupts the pulse-forming network charging cycle, leaving the charging choke energy to automatically fly back and, through the secondary of the charging inductor, dump its residual energy into the power supply filter/storage capacitor.

In the other form shown in that reference, a solid state switch, such as a thyristor, etc., closes the circuit between the charging conductor secondary and the power supply/filter storage capacitor at the time the pulse-forming network predetermined charge point is reached.

It will be seen from the foregoing that the principle of residual charging inductor energy recovery is, of itself, known. However, in the form of FIG. 50(a) of the reference, a high voltage series triode is required. The somewhat simpler form of FIG. 50(b) of the reference involves the use of a thyristor switch which is subject to the high common mode voltage of the power supply through the secondary charging inductor. A second transformer in that circuit serves only to couple-in the thyristor trigger independently of the common mode voltage but serves no function in isolating this thyristor from the high common mode voltage.

The manner in which the present invention deals with the disadvantages of the prior art in producing a unique energy-conservative regulating power supply will be evident as this description proceeds.

SUMMARY

The invention is a unique combination of power supply elements for the charging of a pulse-forming network, especially in a short duty cycle pulse load application, such as for a pulsed radar transmitter. A charging choke (inductor) is actually the primary of the transformer and is constructed to have the appropriate inductance to match the pulse-forming network parameters and to conform to other system considerations. A level sensor and trigger generator provides a trigger when the pulse-forming network is charged, in the resonant-charging arrangement, to the predetermined point. Substantial energy remains in the magnetic field of the charging inductor, and the aforementioned trigger fires a tyristor-type device which connects a secondary winding associated with the charging inductor to the primary winding of a second transformer which is part of a voltage step-up network. The firing of the thyristor terminates the pulse-forming charging cycle such that this element is ready to be switched to the load, a substantial part of the energy remaining in the charging inductor being, at the same time, switched and fed back to the filter/storage capacitor of the DC power supply which powers the circuits. The secondary of the second transformer directs the return energy to the said filter/storage capacitor through a diode which prevents backdischarge of this capacitor.

A more complete description, taken in connection with the figure presented, follows.

BRIEF DESCRIPTION OF THE DRAWING

A single FIGURE is presented showing an electrical schematic of a typical radar pulse-modulator arrangement with charging circuit according to the invention.

DESCRIPTION OF THE PREFERRED EMBODIMENT

Referring now to the figure, the invention and the associated elements of a typical utilization system are shown. The power supply 10 might be any form of alternating current rectification device or inverter-type power supply providing dc, as well known in this art. Preferably, the high voltage supply 10 should include at least some sort of coarse voltage regulation to reduce the dynamic range required of the regulator-type charging circuit to be described. it is emphasized, however, that the regulated charging circuit can be designed to accommodate relatively large variations in the output of the power supply 10. The capacitor 15 is a filter/storage capacitor and may be the only filter/capacitor associated with 10, although the supply may include other filtering components within block 10.

The reader familiar with line-type pulse modulators will recognize the conventional charging inductor (choke) 13, the holdoff diode 16, the pulse transformer 18, the high-powered pulse transformer with primary 19 and secondary 20, and the typical modulator switch tube 17 (which may be a hydrogen thyratron, or the like).

If it is assumed that a transmitter pulse has just been completed, then thyratron 17 is not conducting and filter/storage capacitor 15 is charged at or near its maximum nominal terminal voltage, current flows through the charging inductor 13 and through the hold-off diode 16 into the pulse-forming network 18, charging it. The system is preferably of the so-called resonant charging type, the value of the charging inductor 13 being chosen accordingly. It is, designwise, inevitable that the network 18 reached is predetermined charge, while substantial energy remains in magnetic fields surrounding 13. As previously indicated, some prior art, so-called, de-Q-ing arrangements involve the dumping of this residual energy into a nonreactive load where it is dissipated as heat.

The time constants of the circuit elements are necessarily such that the charging inductor 13 still retains a magnetic field representing a substantial fraction of the total energy of each network pulse.

The primary 19 of the high-powered pulse transformer provides essential continuity for the charging of the pulse-forming network 18 without appreciably affecting the charging rate thereof. The network 18 is typically constructed as a lumped parameter transmission line, which when short-circuited to ground by 17 at the time of the transmitter pulse, dumps a relatively flat-topped pulse of energy into the primary 19, the same then appears across the secondary 20 for excitation of the RF power tube 21. The generation of the radar system trigger applied at 22 is, of course, well understood in this art and is not a part of the present invention per se. If the design of the charging circuit, i.e. parameter selection, is appropriate, the interpulse period between successive triggers at 21 need not be uniform and can, in fact, be variable over a wide time range, as long as the overall duty cycle remains relatively low.

The hold-off diode 16 serves to prevent the discharging of the line 18 in the period between the achievement of full nominal charge of 18 and the application of the next trigger at 22. A voltage divider comprised of resistors 23 and 24 fractionates the relatively high voltage extant at the junction of 16 and 18 and, therefore, is appropriately designed to be of relatively high overall resistance value with the value of 24 being relatively small compared to 23 so that the maximum voltage at the junction of 23 and 24 is a relatively small fraction of that at the junction of 16 and 18. Thus, a voltage level sensor and trigger generator 25 may be a comparatively low voltage device, providing the trigger to the thyristor device 26.

As hereinbefore indicated, the occurrence of the trigger from 25 which is fed to 26 to cause the firing thereof is essentially coincident with the achievement of nominal charge or terminal voltage on 18. Prior to that time, the thyristor 26 is essentially an open circuit in its main current path, and therefore, the secondary 14 of the charging inductor is unloaded and has substantially no effect upon the operation of the primary 13 as a two-terminal inductor. Once the thyristor 26 is fired, however, the effect is to transfer this residual energy in the magnetic field of the charging inductor to the primary 27 of the second transformer which comprises a part of the step-up network. The pulse of this residual energy handled in the circuit including 14, 26 and 27 is at relatively low voltage, although substantial currents are obviously involved. This low voltage operation of the return energy control circuit is possible since the step-up ratio from the primary 27 to the secondary 28 to the second transformer is appreciable. In one particular design, this ratio was on the order of 1 to 50 so that much higher voltages are present at the ungrounded terminal of the secondary 28.

Diode 32 acts as a forward-conducting "check valve" during this return energy time. So that the said return energy is not dissipatively absorbed in 10, an additional diode 12 is provided which is automatically back-biased as soon as the accumulated potential on capacitor 15 exceeds that instantaneously present on the line 11.

Diode 29 is a "back swing" diode which absorbs the relatively small back swing after the main recovery energy pulse has passed. The thyristor 26, which may actually be on SCR, must have a "hard turn-on" in order to mark the point of pulse-forming network peak charge, since this is basically the charge-regulating mechanism. Capacitor 31 tends to provide this "hard turn-on" by stabilizing the ungrounded terminal of primary 27 of the second transformer to which the SCR 26 is directly connected. Damping resistor 30 may or may not be required, depending upon the particular parameters and system requirements of a particular design; however, its use has a damping effect.

A small amount of series inductance added in the main current carrying path of the SCR 26 (not shown) would serve to limit the rate of current change therethrough and operate to protect 26 from unnecessarily severe current transients.

From the foregoing description, it will be realized that the circuitry beginning at the junction of resistors 23 and 24 and extending up through the primary winding 27 of the second transformer and including the secondary 14 of the charging inductor is all operated at relatively low voltages. Accordingly, efficiency and economy is well served by the implementation described.

It is not intended that the scope of the invention should be considered limited by the drawing of this description, these being typical and illustrative only. Many variations will suggest themselves to those skilled in this art which fall within the scope of the invention.

What is claimed is:

1. A charging circuit for a pulse-forming network in a line-type pulse modulator including a high voltage power supply with a filter/storage capacitor and a circuit for at least partially discharging said modulator line periodically to form high voltage pulses, comprising:

a first diode and a charging inductor have a primary winding connected in series between the high voltage terminal of said filter/storage capacitor and said pulse-forming network, said charging inductor having a secondary winding of fewer turns as compared to said primary, whereby it can operate as a step down transformer;

trigger means responsive to the instantaneous voltage across said pulse-forming network for generating a control trigger when said instantaneous voltage reaches a predetermined level;

and energy return means initiated by said control trigger and comprising a step-up second transformer for coupling residual charging inductor energy from said charging inductor secondary winding to the primary winding of said second transformer at low voltage compared to the voltage of said power supply, the secondary winding of said second transformer being connected to said filter/storage capacitor through a second diode to recover at least a portion of the residual energy extant in said charging inductor after each cyclical recharge of said pulse-forming network.

2. Apparatus according to claim 1 in which said energy return means comprises a solid state electronic switch element connected to switch a current path on and off between said charging inductor secondary and said second transformer primary, said switch element being responsive to said control trigger.

3. Apparatus according to claim 2 in which said solid state switch element is a thyristor.

4. Apparatus according to claim 2 in which a third diode is inserted between said power supply and said filter/storage capacitor, said third diode being poled to substantially prevent diversion of the current from said residual energy supplied through said second transformer secondary and said second diode.

5. Apparatus according to claim 3 in which a third diode is inserted between said power supply and said filter/storage capacitor, said third diode being poled to substantially prevent diversion of the current from said residual energy supplied through said second transformer secondary and said second diode.

6. Apparatus according to claim 4 in which a third diode is inserted between said power supply and said filter/storage capacitor, said third diode being poled to substantially prevent diversion of the current from said residual energy supplied through said second transformer secondary and said second diode.

* * * * *